United States Patent [19]

Evans, Jr. et al.

[11] 4,341,918
[45] Jul. 27, 1982

[54] HIGH VOLTAGE PLANAR MULTIJUNCTION SOLAR CELL

[75] Inventors: John C. Evans, Jr., Ravenna; An-Ti Chai, N. Ridgeville; Chandra P. Goradia, Cleveland, all of Ohio

[73] Assignee: The United States of America as represented by the Administrator of the National Aeronautics and Space Administration, Washington, D.C.

[21] Appl. No.: 219,677

[22] Filed: Dec. 24, 1980

[51] Int. Cl.³ .................................................. H01L 31/06
[52] U.S. Cl. ........................................ 136/249; 357/30
[58] Field of Search ................ 136/249 MS; 357/30 J

[56] References Cited

U.S. PATENT DOCUMENTS

| | | | |
|---|---|---|---|
| 4,110,122 | 8/1978 | Kaplow et al. | 136/249 MS |
| 4,144,096 | 3/1979 | Wada et al. | 136/249 MS |
| 4,169,738 | 10/1979 | Luque | 136/246 |
| 4,199,377 | 4/1980 | Corwin et al. | 136/255 |

Primary Examiner—Aaron Weisstuch
Attorney, Agent, or Firm—Norman T. Musial; John R. Manning; Gene E. Shook

[57] ABSTRACT

A high voltage multijunction solar cell is provided wherein a plurality of discrete voltage generating regions or unit cells are formed in a single generally planar semiconductor body (12). The unit cells comprise a doped regions (20, 22) of opposite conductivity type separated by a gap or undiffused region (24). Metal contacts (26) connect adjacent cells together in series so that the output voltages of the individual cells are additive. In some embodiments, doped field regions (14) separated by gap (16) overlie the unit cells but the cells may be formed in both faces of the wafer (FIG. 2).

12 Claims, 3 Drawing Figures

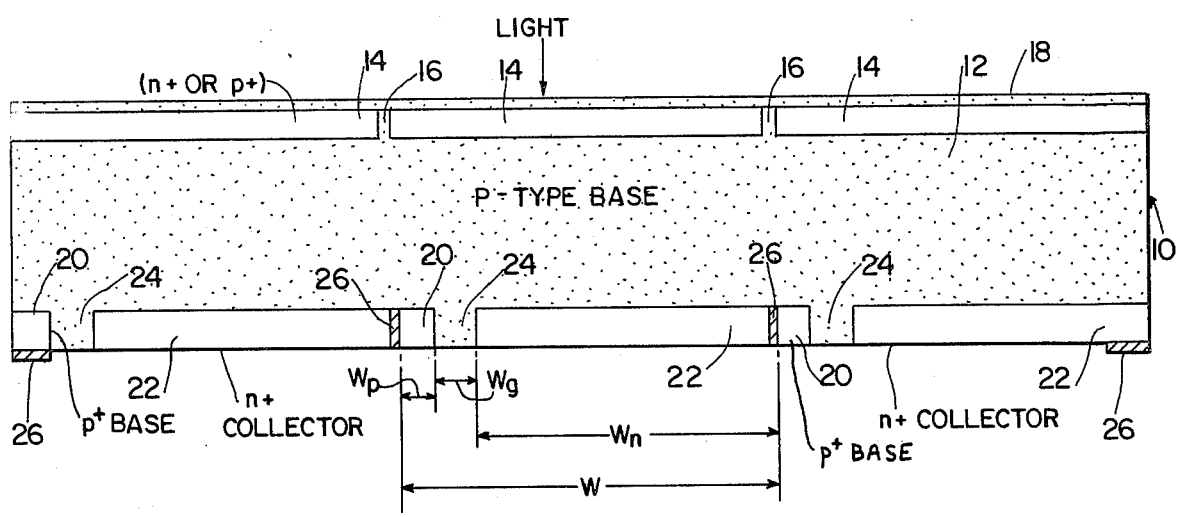
FIG. 1
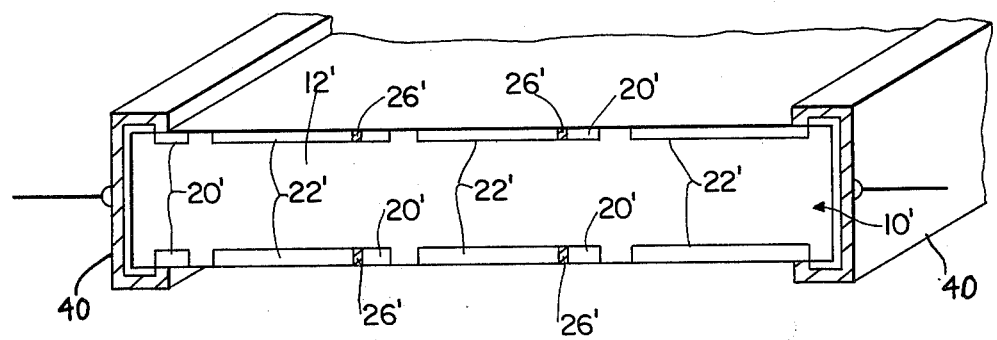
FIG. 2
FIG. 3
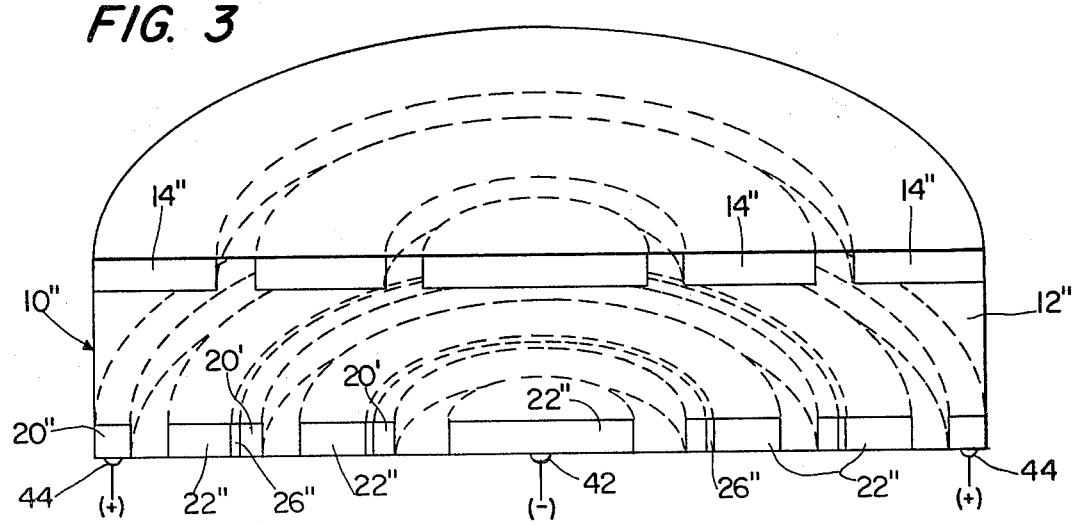

HIGH VOLTAGE PLANAR MULTIJUNCTION SOLAR CELL

ORIGIN OF THE INVENTION

The invention described herein was made by the employees of the U.S. Government and may be manufactured and used by or for the Government for governmental purposes without the payment of any royalties thereon or therefor.

TECHNICAL FIELD

The present invention relates to solar cells and, in particular, to an improved solar cell construction capable of generating comparatively high voltages.

BACKGROUND ART

Photovoltaic power systems are undergoing rapid development as primary power sources for space as well as for terrestial uses. The early space shuttle flights will utilize a power extension pack (PEP) solar cell array to provide approximately 32 kilowatts of electrical power from over seventy thousand large area silicon solar cells. This solar cell array will measure approximately 240 feet in length and will be capable of being retrieved and returned to Earth between missions. Domestically, arrays producing up to one-half megawatt of electrical power are being produced. Further, in addition to these and other large power projects, there are many other specialized applications wherein there are unique power requirements. Thus, there exists a serious need for solar cell constructions which provides a high voltage output and can serve pressing demands both on the Earth and in space.

Early work in this field began with the "solar battery" developed by Bell Telephone Laboratories in 1954. (See Chapin et al, "Bell Solar Battery", *Bell Laboratories Record*, Vol. 37, 1955, pp. 241 et seq.). This battery or cell basically comprised a "wraparound" junction device wherein the base was covered with a thin diffused layer over its entire surface except for a circular area etched on the back of the cell. Ohmic contacts were made to the respective "n" and "p" regions. This "wraparound" device evolved into a rectangular planar form with a diffused surface having a metal grid collector on the top side and a metal pad collector on the bottom. This form of cell is still the most commonly used for space solar cells. Reference is made to Matlow et al, "Ohmic Aluminum-n-Type Silicon Contact", *Journal of Applied Physics*, Volume 30, April 1959, pp. 541–543 for a discussion of such cells.

In the 1960's, a photovoltaic device, the thermophotovoltaic (TPV) cell, was developed which converted a narrow portion of the thermal spectrum into electrical energy. The device utilized an interdigitated contact structure covering the back of a germanium cell wafer. Because the device utilized narrow band heat radiation, photons are absorbed uniformly throughout the bulk of the wafer, and thus this type of back contact was satisfactory. However, for most visible light conversion, wherein most of the light is absorbed close to the surface and wherein migration of the carriers is effected by diffusion to the collectors, such a back contact arrangement requires several concessions. For example, the device must be thin and must be made of high quality semiconductor material having a very high lifetime. The TPV cell evolved into the interdigitated back contact silicon solar cell.

In more recent times, a modification of the coplanar back contact solar cell was developed which is known as the Tandem Junction (TJC) solar cell. This device relies on a front surface field region in order to lower surface recombination losses and to provide an electrostatic field region which assists in sending the carriers to the rear surface of the cell for collection. Reference is made to Chiang et al, "Thin Tandem Junction Solar Cell", *Conference Record, 13th IEEE Photovoltaic Specialists Conference*, IEEE, Inc., New York, 1978, pp. 1290–1293 and to U.S. Pat. No. 4,113,698 (Chiang et al) for a further discussion of TJC cells. The subject matter of these materials is hereby incorporated by reference. Other important developments include Vertical Multijunction (VMJ) solar cell (see Gorandia et al, *IEEE Trans. on Electron Devices*, Vol. ED-24, p. 342, April 1977), the Horizontal Multijunction (HMJ) solar cell (see U.S. Pat. No. 3,994,012 (Warner)), and the V-Groove Multijunction (VGMJ) solar cell (see Chappell, *IEEE Trans. on Electron Devices*, Vol. ED-26, p. 1,091, July 1979).

In general, all of the more recently developed devices, including the IBC, TJC, VMJ, HMJ, and VGMJ solar cells, represent improvements over the prior art particularly with respect to reduction or elimination of grid-shadowing and the sheet resistance component of series resistance. Further, all of the cells except for the IBC and TJC cells, operate as high-voltage low-current devices and thus provide a reduction in series resistance as well as in temperature effects due to $I^2R$ heating. In addition, significant transparency to infrared photons further reduces high temperature effects in these cells.

Other patents of possible interest in this field include U.S. Pat. Nos. 3,150,990 (Rudenberg); 3,278,337 (Gault) 3,969,746 (Kendall et al); 3,982,964 (Lindmayer et al); 4,052,228 (Russell); 4,072,541 (Meulenberg, Jr. et al); 4,099,199 (Wittry); 4,101,351 (Shah et al); 4,128,733 (Fraas et al); 4,131,486 (Brandhorst, Jr.); 4,135,950 (Rittner); 4,160,678 (Jain et al); 4,166,919 (Carlson); 4,167,015 (Hanak); 4,217,633 (Evans, Jr.).

SUMMARY OF THE INVENTION

In accordance with the invention, an improved solar cell of the photovoltaic type is provided which produces a high output voltage. Generally speaking, the cell comprises a plurality or array of discrete voltage-generating regions or unit cells formed within a semiconductor wafer and integrally interconnected in such a manner so as to provide a single device having a high voltage output. Stated differently, the high voltage multijunction solar cell of the invention comprises a generally planar semiconductor body and a plurality of unit cells formed in at least one surface of the semiconductor body, the unit cells each comprising a pair of doped regions of opposite conductivity type separated by a gap therebetween and the unit cells being connected together so that the voltage outputs of the individual cells are additive.

The invention is particularly concerned with the problems of degradation and efficiency loss due to heating in the device. There are two primary causes of this heating, the trapping and absorption of infrared or heating photons, and heating due to internal electrical resistance, sometimes referred to as "Joule" heating. The invention provides a photovoltaic type cell which avoids both of these sources of energy conversion loss.

More specifically, in the solar cell device of the invention, the photons capable of producing ionization are absorbed in a high-lifetime bulk region in the semiconductor wafer. The hole-electron pairs are collected at the doped regions which are preferably arranged in parallel and which form the unit cells within the wafer. In a specific embodiment, each unit cell comprises an n+ doped region separated by a gap from a p+ doped region. These regions may be formed by thermal diffusion or ion implantation. In this specific embodiment, the individual voltage-generating unit cells are preferably connected together within the bulk semiconductor by a narrow implanted or diffused ribbon of metal, such as aluminum, which serves to connect the unit cells in series so as to produce an overall output voltage which is the sum of the contributions of all of the unit cells within the semiconductor wafer. For embodiments wherein the device is rectangular in shape, the output of the solar cell is collected at opposite edges of the semiconductor wafer.

Although a rectangular embodiment has been referred to above, it is to be understood that the planar multijunction solar cell of the invention can be made in a number of different configurations and, in this regard, a circular shape utilizing concentric voltage generating region is advantageous for some applications. Further, collection can be from one side only and this one side may be the front or back of the device, depending upon the desired results. Further, the solar cell of the invention can be fabricated as a double-sided device with voltage generating regions (unit cells) on both sides and collection may be from both surfaces. In addition, the device of the invention can be used at one Sun normal incidence or can be used in conjunction with lens or reflector concentration techniques that produce very high solar intensity levels.

The heating problem discussed above is minimal with the device of the invention for two main reasons. First, the device has almost no surface metallization and thus permits substantially free passage of infrared energy completely through the solar cell. Thus, the device requires little or no heat-sinking or cooling. Second, the device of the invention exhibits very little internal electrical resistance, and the energy is extracted at high voltage and low current from the device. It will be understood that heating is related to the current flow and is proportional to the product of the square of the current flowing through the device and the internal impedance or resistance of the device ($W = I^2 R$).

It will be appreciated by those skilled in the photovoltaic art that the planar multijunction solar cell of the invention combines the better features of the interdigitated back contact (IBC) and tandem junction (TJC) cells with the vertical multijunction (VMJ) and horizontal multijunction (HMJ) solar cells discussed above. The device of the invention also is superior in a number of respects to these devices and to the V-groove multijunction solar cell (VGMJ) discussed above. For example, the IBC and TJC devices are not high voltage solar cells and require substantial surface metallization for collection, whereas the device of the present invention does not. Further, the HMJ device involves a rather complex fabrication process while the VGMJ device involves physically separate semiconductor unit cells held together on a glass plate. Moreover, none of the devices of the prior art provide high voltage in a single substrate construction of simple fabrication.

Other features and advantages of the invention will be set forth in, or apparent from, the detailed description of the preferred embodiments found hereinbelow.

BRIEF DESCRIPTION OF THE DRAWINGS

FIG. 1 is a schematic transverse cross sectional view of a planar multijunction solar cell constructed in accordance with one embodiment of the invention;

FIG. 2 is a schematic perspective view, partially broken away, of a second embodiment of the invention; and FIG. 3 is a schematic perspective view of one half of a planar multijunction solar cell constructed in accordance with a third embodiment of the invention.

DETAILED DESCRIPTION

Referring to FIG. 1, a schematic cross section of one embodiment of the planar multijunction high voltage solar cell (PMJ) of the invention is shown. The solar cell, which is generally denoted 10, includes a base region 12 preferably comprising a silicon crystal of a very high lifetime which may be suitably doped with, e.g., boron, to be of n or p type. In a specific example, a 100 ohm-cm p-type crystal having a diffusion length of 400 micrometers and a thickness of 75 to 100 micrometers was utilized. Although experiments have shown an efficiency peak at around 100 ohm-cm p-type material, it is believed that the planar multijunction cell of the invention will operate at resistivities of between about 0.01 ohm-cm and 30,000 ohm-cm and it is noted that advantages related to radiation resistance at higher resistivities may compensate for any conversion efficiency losses found at such higher resistance values. It is noted that although silicon is utilized in the preferred embodiment, the cell of the invention may be made from GaAs or other IIIA-VA semiconductors and from IIB-VIA compounds such as CdS.

Formed in the illuminated top surface of the base region 12 are a plurality of n+ or p+ unit cell field regions denoted 14. Each of the regions 14 is separated from the adjacent regions by a gap 16 which may comprise an undiffused region in base region 12. The field regions 14 correspond to the unit cells which are described below and which are disposed directly beneath corresponding regions 22 on the bottom of the base region. The top, light-receiving surface of the cell 10 is preferably coated with an anti-reflective layer or coating 18 although other techniques such as texturizing can also be used. In addition, this top surface can also be treated or modified to reduce surface recombination velocity and thus increase conversion efficiency. This may be accomplished by the inclusion of a trapped charge oxide layer or by the inclusion of a front surface field of dopant ions. The oxide layer may be formed by wellknown MOS technology while the dopant layer may be thermally diffused or ion implanted.

The unit cells each comprise a pair of doped regions separated by a precisely controlled gap or undiffused region; in FIG. 1, the doped regions are a relatively narrow p+ base region 20 and a relatively wide n+ collector region 22 separated by a gap 24. The unit cells, which have a total width W as indicated in FIG. 1, are connected together by metal (e.g., aluminum) contacts 26 located between the n+ collector regions and p+ base regions of adjacent cells. Contacts 26 serve to connect the individual unit cells or sub-cells within the base 12 in series so that the individual contributions of the unit cells can be summed together.

In a specific exemplary embodiment, regions of phosphorous, boron and aluminum are implanted into the base crystal 12 to form the unit voltage-generating sub-cells, with the widths (denoted Wn) of the n+ regions 22 being about 100 micrometers, the widths (denoted Wp and Wg, respectively) of the p+ regions 20 and the gap or undoped regions 24 being about 25 micrometers. In this exemplary embodiment, the aluminum regions which electrically connect the sub-cells may be from about 5 micrometers to a greater width, depending on the forming technology used to fabricate the cells.

Metal contacts or terminals 26 for connection to an external circuit or circuits are located at opposite edges of the cell 10.

It will be appreciated that the exemplary values set forth above are merely exemplary and in no way limiting. Although the mathematical considerations that should be taken into account in the design of a solar cell of the invention have not been completely worked out, certain preliminary design values for key parameters can be arrived at from physical considerations and from theory developed in connection with the tandem junction solar cell to which reference was made above. From simply physical considerations, the longest path which a photo-generated electron must travel in a cell of thickness h in order to be collected is approximated by the formula $$\sqrt{h^2 + \left(\frac{W_{p+} + W_g}{2}\right)^2}$$

This path length should be shorter than a diffusion length of the electrons in the base region to obtain high collection efficiency. Thus, the values of the parameters h and $(W_{p+}+W_g)/2$ must be individually less, and preferably much less, than the electron diffusion length in the base region. With this constraint it has been determined experimentally for a tandem junction cell that "stripe" widths of Wn=0.85 W, Wp+=0.1 W and Wg=0.05W give high collection efficiency without sacrificing the full factor due to high series resistance and these same fractional stripe widths are thought to hold with the planar multijunction cell of the invention. For a low voltage PMJ solar cell, with only eight unit cells per centimeter, the relationships set forth above result in the following values for the parameters in question: W=1,250 μm; Wn=1,063 μm, Wp+=125 μm, Wg=62 μm. For a high voltage PMJ cell with 40 unit cells per centimeter the values are: W=250 μm, Wn=213 μm, Wp+=25 μm and Wg=12 μm. In these examples, if the cell thickness is 75 μm, the path length for collection will be 120 μm in the low voltage cell and 77 μm in the higher voltage cell. It is noted that a diffusion length in the base of 250 μm or greater would ensure a high collection efficiency in either cell provided that surface recombination losses at the front and back of the cell are low. Based on related experimental results, the junction depth of the diffused regions 14 on the top or front surface of the cell 10 should be 0.2 to 0.3 μm while the depths of the back surface junctions are preferably equal to or greater than 1 micrometer in order to reduce series resistance.

In early experimental cells, Czochralski grown silicon wafers, boron-doped of 2 and 10 ohm-cm resistivities and of circular shape were used as the base or substrate material. An n+/p junction was formed over the entire surface of each circular wafer with conventional phosphine diffusion in a tube furnace at 850° C. for 30 minutes. The diffusion oxide was removed from one face of the wafer and a pattern of parallel bars of aluminum paste was screen-printed on the cleaned surface and fired in a belt furnace at 650° C. with a 40 second pass. This firing time was sufficient to assure penetration of the aluminum through the diffused n+ region on this face. The wafer was then cut into a 1.5 cm by 1.5 cm device. A narrow portion of the n+ region was removed alongside of each aluminum bar on one side of the wafer by making a shallow cut with a dicing saw. This technique was used to form the required gap between corresponding regions 20 and 22. The contacts 26 were fabricated of fired silver paste.

It is noted that initial testing has shown that the isolation of individual unit cell regions 14 over each of the unit cells formed by doped regions 20, 22 is quite important with respect to the output voltages generated. This isolation can be effected, for example, by providing shallow grooves between the regions 14.

Other cells have been made by modifying TJC solar cells wherein several regions were connected together in series on a single substrate, with each region, in effect, constituting a unit cell having a surface field and interdigitated back regions. In another approach involving TJC solar cells, the side bars of such cells were removed and every other gap was shorted out so as to produce unit cell interconnections. This shorting was accomplished by applying small dots of silver paste between the contact bars and firing. Leads were attached to the terminating n+ and p+ regions in a similar manner. The front field region of all of the unit cells were separated by shallow cuts through the diffused layer, using a dicing saw. These cuts were precisely located over the unit cell boundaries as described above.

Two further embodiments of the invention are illustrated in FIGS. 2 and 3. The embodiment of FIG. 2 is similar to that of FIG. 1 and corresponding elements in FIG. 3 have been given the same reference numberals as in FIG. 1 but with primes attached. The only basic difference between the embodiments of FIGS. 1 and 2 is that, in FIG. 2, the unit field regions 14 of FIG. 1 have been replaced by collector regions similar to those in the other surface, i.e., collection regions are formed in both surfaces of the p-type base 10'. As in the embodiment of FIG. 1, unit cells are formed by p+ and n+ regions 20' and 22' separated by a gap, and metal contacts 26' are used to connect the unit cells together. The collector regions in the two surfaces overlie one another as illustrated and a pair of contacts 40 located at opposite edges of the cell assembly are used to make connection to the "terminating" cells, i.e., those at the lateral edges of the assembly.

The embodiment of FIG. 3 is also similar to that of FIG. 1 and corresponding elements in FIG. 3 have been given the same reference numerals as in FIG. 1 but with double primes attached. The basic difference between the embodiments of FIG. 1 and FIG. 3 is that, in the latter, the base 10" is circular in shape and the various regions are disposed in concentric circles. As in the embodiment of FIG. 1, the unit cells formed by doped regions 20" and 22" are disposed below a field region 14" which precisely overlies the unit cell, and contacts 26" are used to connect the unit cells together. The outermost p+ region 20" is connected to a circular positive terminal formed by metallization 44 while the innermost n+ region is connected to a negative or minus terminal 42. A circular solar cell such as shown in FIG. 3 has advantages when, for example, it is used in combination with a circular lens or concentrator-reflectior. It will be understood that this embodiment, similarly to the rectangular cell of FIG. 2, can also employ collector regions on both sides and that such double sided cells may also be illuminated from one or both sides.

Briefly considering the operation of the planar multijunction solar cell of the invention, and referring to FIG. 1, when photons of the proper energy are absorbed in the silicon wafer 10, hole-electron pairs are often produced and these charge carriers are free to move under the field forces of the junction. Carriers are separated and collection and utilization through an external load circuit (not shown) will take place so that solar energy is thus converted to electricity. All photovoltaic solar cells follow this basic sequence of absorption, pair production, charge separation and collection. When the surface counter-doped region is moved to the bottom of the device, as in the IBC devices discussed above, the same principles apply, although the electric field configuration may be somewhat different. The collection and current flow is in a sheet close to the surface and along the surface, rather than through the thickness of the device. The presence of the dopant ions within the crystal lattice in the solar cell of the invention provides a built-in electrical field for the separation of the opposite charge carriers. The collected electrons, which comprise the carriers which move physically through the external circuit referred to above are driven by an electromotive force which is generated across the device as long as the photons are available and being used. The amount of electron current available in a properly matched external load is a function of several factors, including the solar conversion efficiency of the cell, the illuminated active area of the device and the solar intensity and it is possible to increase the latter greatly by the use of lenses or concentractor-reflectors as referred to above. The output voltage and the current of the device may increase dramatically with high light levels.

In our concurrently filed, copending application Ser. No. 219,678 entitled HIGH VOLTAGE V-GROOVE SOLAR CELL, there is disclosed a method of making a planar multijunction solar cell wherein grooves are formed in the surface of the planar wafer and doped regions of opposite conductivity type formed in the faces of the grooves. It is to be understood that the term "surface", as applied to the semiconductor body, when used in this specification and in the claims, without further description, refers to a flat surface such as shown in FIGS. 1 to 3 as well as to a grooved or otherwise non-planar surface.

Although the invention has been described in relation to exemplary embodiments thereof, it will be understood by those skilled in the art that variations and modifications can be effected in these exemplary embodiments without departing from the scope and spirit of the invention.

We claim:

1. A high voltage multijunction solar cell comprising:
   a generally planar semiconductor body of one conductivity type;
   a plurality of unit cells formed within at least one surface of said semiconductor body, each said unit cell comprising a pair of doped regions of opposite conductivity type formed in said at least one surface and separated by a gap region consisting essentially of an undiffused region of said semiconductor body, each said gap region providing electrical isolation means between adjacent unit cells; and
   means for connecting said unit cells together so that the voltage outputs of the unit cells are additive.

2. A solar cell as claimed in claim 1 including means forming a corresponding plurality of field regions in said semiconductor body overlying said plurality of unit cells.

3. A solar cell as claimed in claim 1 wherein said means for connecting said unit cells together comprises metallization for connecting together adjacent unit cells in said semiconductor body, said metallization connecting together regions of one conductivity type to adjacently disposed regions of opposite conductivity type.

4. A solar cell as claimed in claim 3 wherein said metallization comprises metal contacts disposed between said regions of opposite conductivity type.

5. A solar cell as claimed in claim 1 wherein said semiconductor body is rectangular in shape and said doped regions comprises parallel, longitudinally extending stripe-like regions in said body.

6. A solar cell as claimed in claim 1 or 5 wherein said unit cells are formed in major opposed surfaces of said semiconductor body.

7. A solar cell as claimed in claim 1 wherein said semiconductor body is circular in configuration and said unit cells form a pattern of concentric circles within said at least one surface of said semiconductor body.

8. A solar cell as claimed in claim 1 wherein said body is fabricated of a semiconductor selected from IIIA-VA compounds and IIB-VIA compounds.

9. A solar cell as claimed in claim 1 wherein said at least one surface of said semiconductor body comprises a major flat, planar surface.

10. A high voltage multijunction solar cell comprising
    a generally planar semiconductor body of one conductivity type;
    a plurality of unit cells formed within a first surface of said semiconductor body, said unit cells each comprising a pair of doped regions of opposite conductivity type formed in said first surface and separated by a gap region consisting essentially of an undiffused region of said semiconductor body, the opposite surface of said semiconductor body including a plurality of doped unit cell field regions formed therein, each of said field regions directly overlying a corresponding unit cell formed in said first surface of said semiconductor body and being of a width equal to the width of that unit cell, each of said field regions being separated from adjacent field regions by a gap region consisting essentially of an undiffused region of said semiconductor body, and
    means for connecting said unit cells together so that the voltage outputs of the unit cells are additive.

11. A solar cell as claimed in claim 10 wherein said cell further comprises an antireflective coating formed over said unit cell field regions.

12. A solar cell as claimed in claim 10 wherein said semiconductor body comprises a p-type base material and said doped regions of said unit cells comprise a relatively narrow p+ base region and a relatively wide n+ collection region.

* * * * *